(12) United States Patent  (10) Patent No.: US 7,323,883 B2
Nakada  (45) Date of Patent: Jan. 29, 2008

(54) PHASE MEASUREMENT DEVICE, METHOD, PROGRAM, AND RECORDING MEDIUM

(75) Inventor: Juichi Nakada, Saitama (JP)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 10/557,596

(22) PCT Filed: May 19, 2004

(86) PCT No.: PCT/JP2004/007125

§ 371 (c)(1),
(2), (4) Date: Jan. 18, 2006

(87) PCT Pub. No.: WO2004/104603

PCT Pub. Date: Dec. 2, 2004

(65) Prior Publication Data

US 2007/0069766 A1   Mar. 29, 2007

(30) Foreign Application Priority Data

May 23, 2003   (JP) .............................. 2003-145974

(51) Int. Cl.
*G01R 23/20* (2006.01)
*G01R 23/16* (2006.01)
(52) U.S. Cl. .................................. 324/622; 324/76.21
(58) Field of Classification Search ................ 324/613, 324/622, 620, 623, 626, 76.78, 76.21
See application file for complete search history.

(56) References Cited

U.S. PATENT DOCUMENTS 2,929,987 A * 3/1960 Royal et al. ................. 324/622
4,071,821 A * 1/1978 Harthill et al. ........... 324/76.77
5,025,221 A * 6/1991 Blaess ......................... 324/603

(Continued)

FOREIGN PATENT DOCUMENTS

JP           7-229944           8/1994

(Continued)

OTHER PUBLICATIONS

English Language Abstract of JP 2001-285211.

(Continued)

*Primary Examiner*—Anjan Deb
(74) *Attorney, Agent, or Firm*—Greenblum & Bernstein, P.L.C.

(57) ABSTRACT

When a signal having two or more frequency components is fed to a circuit to be measured, a phase of the signal output from the circuit to be measured is measured. A phase measurement device measures an output when an input signal having two input frequency components $\omega 10$ and $\omega 20$ is fed to an amplifier (circuit to be measured). The phase measurement device includes an orthogonal converter that subjects the output of the amplifier to an orthogonal conversion using an average frequency $\omega 0$, which is an average of $\omega 10$ and $\omega 20$. A phase acquisitioner acquires phases $\theta 1$ and $\theta 2$ of the input frequency components in the output of the orthogonal converter and a phase $\theta 3$ of a distortion component. A match time/phase measurer measures a match time $\Delta t$ during which phase $\theta 1$ is matched with phase $\theta 2$, and measures phase $\theta 1 (\Delta t)$ during that time. A distortion component phase measurer measures phase $\theta 3 (\Delta t)$ of the distortion component in the match time $\Delta t$. A display then displays $\theta 1 (\Delta t)$ and $\theta 3 (\Delta t)$.

11 Claims, 6 Drawing Sheets

U.S. PATENT DOCUMENTS 5,218,289 A * 6/1993 Besson ............... 324/76.78
5,396,656 A * 3/1995 Jasper et al. ............ 455/295
5,649,304 A * 7/1997 Cabot ................. 455/67.14
5,789,927 A * 8/1998 Belcher ................. 324/622

FOREIGN PATENT DOCUMENTS

JP  2000-314753  11/2000
JP  2001-251211  10/2001
JP  2002-228694  8/2002

OTHER PUBLICATIONS

English Language Abstract of JP 2002-228694.
English Language Abstract of JP 2000-314753.
English Language Abstract of JP 7-229944.

* cited by examiner

PHASE MEASUREMENT DEVICE, METHOD, PROGRAM, AND RECORDING MEDIUM

TECHNICAL FIELD

The present invention relates to a measurement of a phase of a distortion of a signal output from a non-linear circuit (circuit to be measured) upon a signal having at least two frequency components is fed to the non-linear circuit.

BACKGROUND ART

It has conventionally been a general practice to amplify a signal by feeding the signal to an amplifier. It is ideal that the amplifier is a linear circuit. However, it is difficult to manufacture an amplifier which is a completely linear circuit, and an amplifier is thus treated as a type of a non-linear circuit. Namely, if a signal is fed to an amplifier, a distortion component in addition to an amplified signal is output.

A measurement of such a distortion component has been practiced as described in Patent Document 1 (Japanese Laid-Open Patent Publication (Kokai) No. 2001-285211 (ABSTRACT)), for example.

However, a measurement of a phase of a distortion component output from an amplifier has not been practiced conventionally upon a signal having at least two frequency components being fed to the amplifier.

An object of the present invention is to measure a phase of a distortion of a signal output from a circuit to be measured upon a signal having at least two frequency components is fed to the circuit to be measured.

DISCLOSURE OF THE INVENTION

According to an aspect of the present invention, a phase measurement device that measures an output from a circuit to be measured upon feeding an input signal having at least two input frequency components to the circuit to be measured, includes: a phase acquisition section that acquires phases of the input frequency components and a distortion component based upon an average frequency which is an average of the input frequency components; a match time measurement unit that measures a match time at which the phases of the input frequency components match based upon an acquired result by the phase acquisition section; and a distortion component phase measurement unit that measures a phase of the distortion component at the match time based upon an acquired result by the phase acquisition section.

According to the thus constructed phase measurement device, a phase measurement device measures an output from a circuit to be measured upon feeding an input signal having at least two input frequency components to the circuit to be measured. A phase acquisition section acquires phases of the input frequency components and a distortion component based upon an average frequency which is an average of the input frequency components, and a match time measurement unit measures a match time at which the phases of the input frequency components match based upon an acquired result by the phase acquisition section. Furthermore, a distortion component phase measurement unit measures a phase of the distortion component at the match time based upon an acquired result by the phase acquisition section.

According to the phase measurement device of the present invention, the phase acquisition section may include: an orthogonal conversion unit that applies an orthogonal conversion to the output from the circuit to be measured using an average frequency which is an average of the input frequency components; and a phase acquisition unit that acquires the phases of the input frequency components and the distortion component in an output from the orthogonal conversion unit.

The phase measurement device of the present invention, may includes a match phase measurement unit that measures the phases of the input frequency components at the match time.

According to the phase measurement device of the present invention, the circuit to be measured may be an amplifier.

According to the phase measurement device of the present invention, the phase acquisition unit may include a complex fast Fourier transform unit that carries out the complex fast Fourier transform.

According to the phase measurement device of the present invention, the complex fast Fourier transform unit may acquire a complex vector for a digital signal.

The phase measurement device of the present invention may includes a display unit that displays a result of the measurement by the distortion component phase measurement unit.

The phase measurement device of the present invention may includes a display unit that displays a result of the measurement by the match phase measurement unit, and a result of the measurement by the distortion component phase measurement unit.

According to another aspect of the present invention, a phase measurement method for measuring an output from a circuit to be measured upon feeding an input signal having at least two input frequency components to the circuit to be measured, includes: a phase acquisition step of acquiring phases of the input frequency components and a distortion component based upon an average frequency which is an average of the input frequency components; a match time measurement step of measuring a match time at which the phases of the input frequency components match based upon an acquired result by the phase acquisition step; and a distortion component phase measurement step that measures a phase of the distortion component at the match time based upon an acquired result by the phase acquisition step.

Another aspect of the present invention is a program of instructions for execution by the computer to perform a phase measurement process of a phase measurement device that measures an output from a circuit to be measured upon feeding an input signal having at least two input frequency components to the circuit to be measured, having: a phase acquisition section that acquires phases of the input frequency components and a distortion component based upon an average frequency which is an average of the input frequency components; the phase measurement process including: a match time measurement step of measuring a match time at which the phases of the input frequency components match based upon an acquired result by the phase acquisition section; and a distortion component phase measurement step of measuring a phase of the distortion component at the match time based upon an acquired result by the phase acquisition section.

Another aspect of the present invention is a computer-readable medium having a program of instructions for execution by the computer to perform a phase measurement process of a phase measurement device that measures an output from a circuit to be measured upon feeding an input signal having at least two input frequency components to the circuit to be measured, having: a phase acquisition section that acquires phases of the input frequency components and a distortion component based upon an average frequency which is an average of the input frequency components; the phase measurement process including: a match time measurement step of measuring a match time at which the phases of the input frequency components match based upon an acquired result by the phase acquisition section; and a distortion component phase measurement step of measuring a phase of the distortion component at the match time based upon an acquired result by the phase acquisition section.

BRIEF DESCRIPTION OF THE DRAWINGS

FIG. 2 is a diagram showing an operation of the amplifier 20, wherein FIG. 2(a) shows a frequency spectrum of the input signal fed to the amplifier 20, FIG. 2(b) shows a frequency spectrum of the output from the amplifier 20, and FIG. 2(c) shows a frequency spectrum of the output from the amplifier 20 if a frequency $\omega 0$ (=($\omega 10+\omega 20$)/2) is set to 0;

BEST MODE FOR CARRYING OUT THE INVENTION

A description will now be given of an embodiment of the present invention with reference to drawings.

Figure 1:
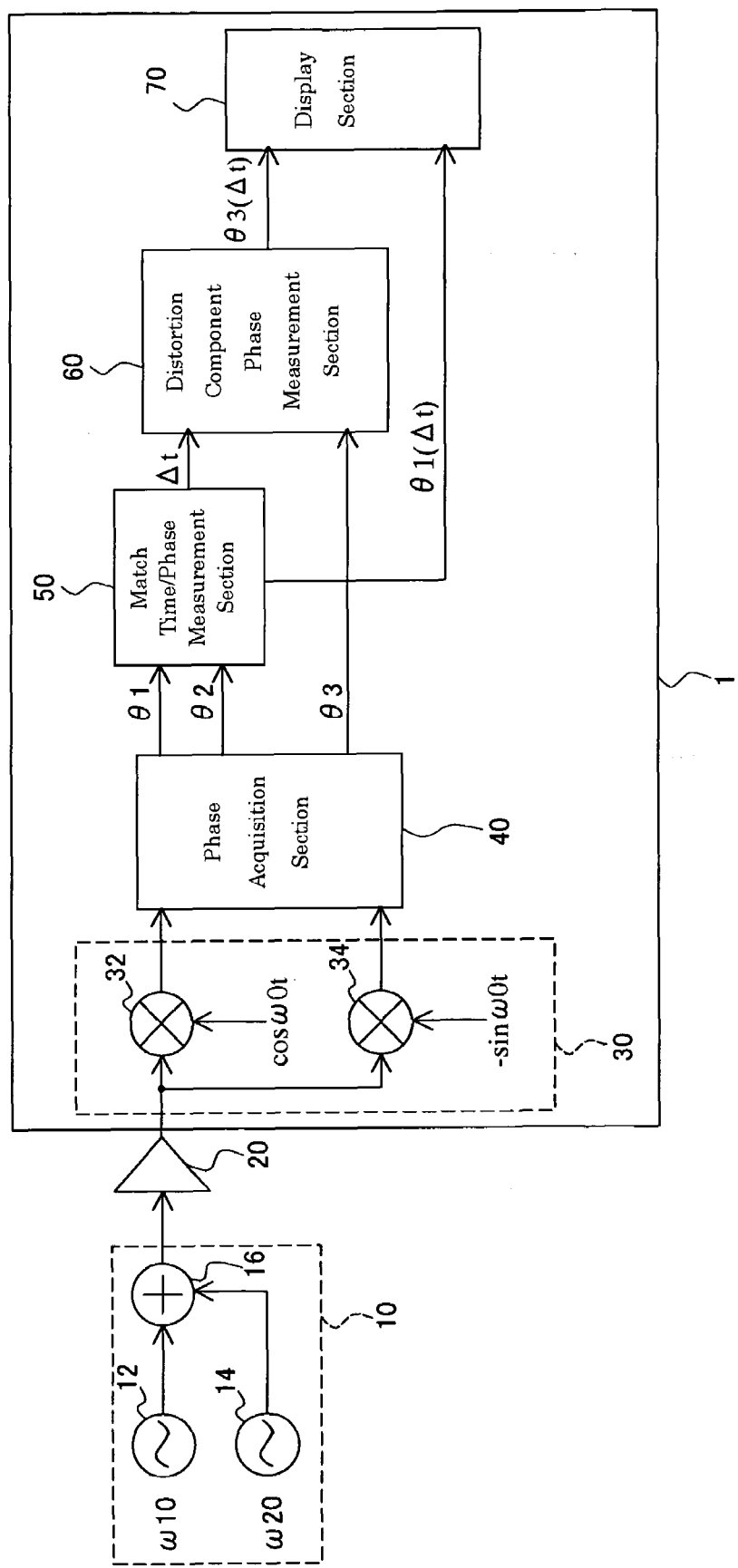
FIG. 1 is a block diagram showing a configuration of an amplifier measurement system according the embodiment of the present invention.

FIG. 1 is a block diagram showing a configuration of an amplifier measurement system according the embodiment of the present invention. The amplifier measurement system is provided with an input signal generation section 10, an amplifier (circuit to be measured) 20, an orthogonal conversion section 30, a phase acquisition section 40, a match time/phase measurement section 50, a distortion component phase measurement section 60, and a display section 70. It should be noted that the orthogonal conversion section 30, the phase acquisition section 40, the match time/phase measurement section 50, the distortion component phase measurement section 60, and the display section 70 constitute a phase measurement device 1.

The input signal generation section 10 generates an input signal having two input frequency components $\omega 1$ and $\omega 2$. The input signal generation section 10 includes a first oscillator 12, a second oscillator 14, and an adder 16. The first oscillator 12 generates a signal of a frequency $\omega 10$. The second oscillator 14 generates a signal of a frequency $\omega 20$. The adder 16 adds the signal of the frequency $\omega 10$ and the signal of the frequency $\omega 20$ to each other, and outputs a result of the addition. An output from the adder 16 is the input signal. The input signal is fed to the amplifier 20.

Figure 2:
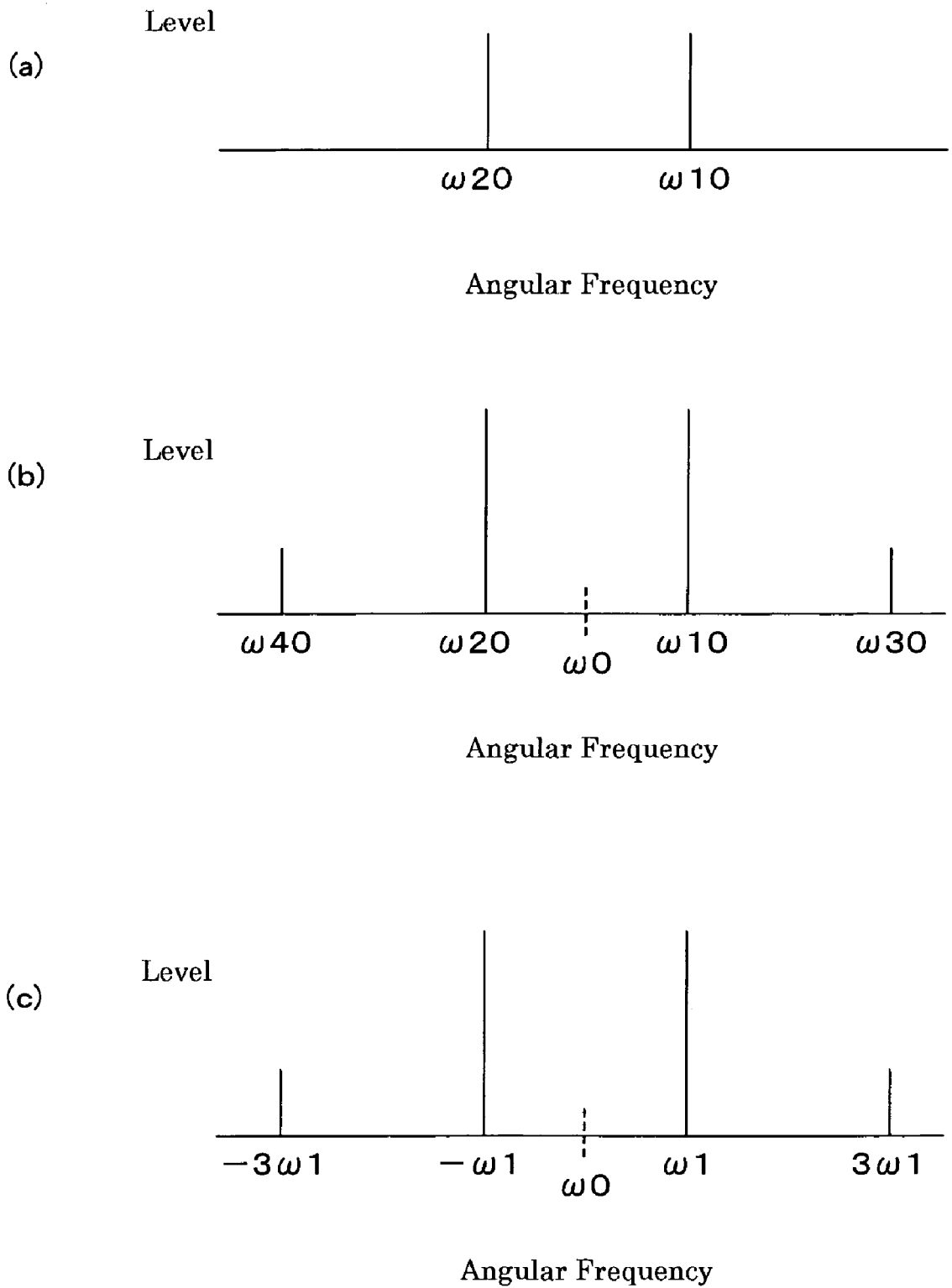

The amplifier (circuit to be measured) 20 amplifies the fed input signal, and outputs a result of the amplification. A description will now be given of an operation of the amplifier 20 with reference to FIG. 2. A frequency spectrum of the input signal fed to the amplifier 20 includes components of the frequency $\omega 10$ and the frequency $\omega 20$ as shown in FIG. 2(a). The amplifier 20 amplifies the input signal, and outputs the result of the amplification.

A frequency spectrum of the output from the amplifier 20 is shown in FIG. 2(b). It is recognized that levels of the components of the frequency $\omega 10$ and the frequency $\omega 20$ rise. However, it is difficult to produce the amplifier 20 as a completely linear circuit, and the amplifier 20 is thus a non-linear circuit. As a result, there are output components (referred to as distortion components) of a frequency $\omega 30$ and a frequency $\omega 40$ in addition to the components of the frequency $\omega 10$ and the frequency $\omega 20$.

On this occasion, if a frequency $\omega 0$ which is an average of the frequency $\omega 10$ and the frequency $\omega 20$ (=($\omega 10+\omega 20$)/2) is set to 0, the frequency spectrum of the output from the amplifier 20 is represented as FIG. 2(c). Namely, $\omega 10$ is represented as $\omega 1$ (=$\omega 10-\omega 0$); $\omega 20$ is represented as $-\omega 1$ (=$\omega 20-\omega 0$); $\omega 30$ is represented as $3\omega 1$ (=$\omega 30-\omega 0$); and $\omega 40$ is represented as $-3\omega 1$ (=$\omega 40-\omega 0$).

The phase measurement device 1 measures the output from the amplifier (circuit to be measured) 20. It should be noted that the phase measurement device 1 is provided with the orthogonal conversion section 30, the phase acquisition section 40, the match time/phase measurement section 50, the distortion component phase measurement section 60, and the display section 70.

The orthogonal conversion section 30 applies the orthogonal conversion to the output from the amplifier 20 using the average frequency $\omega 0$, which is the average of the input frequency components (of the frequency $\omega 10$ and the frequency $\omega 20$). As a result, the frequency spectrum of output from the amplifier 20 shown in FIG. 2(b) can be treated as the frequency spectrum shown in FIG. 2(c). The orthogonal conversion section 30 is provided with multipliers 32 and 34. The multiplier 32 multiplies the output from the amplifier 20 by $\cos(\omega 0 \cdot t)$, and outputs a result of the multiplication. The multiplier 34 multiplies the output from the amplifier 20 by $-\sin(\omega 0 \cdot t)$, and outputs a result of the multiplication.

Figure 3:
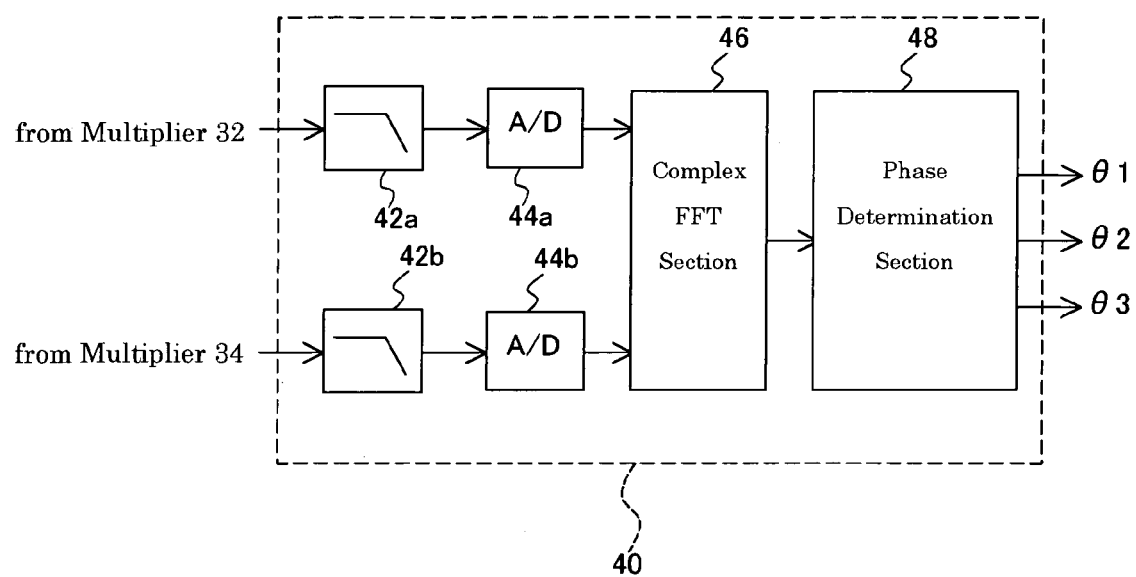
FIG. 3 is a block diagram showing a configuration of the phase acquisition section 40.

The phase acquisition section 40 acquires phases of the input frequency components ($\pm\omega 1$) and the distortion component ($+3\omega 1$) in the output of the orthogonal conversion section 30. FIG. 3 is a block diagram showing a configuration of the phase acquisition section 40. The phase acquisition section 40 includes low-pass filters 42a and 42b, A/D converters 44a and 44b, a complex FFT (Fast Fourier Transform) section 46, and a phase determination section 48.

The low-pass filter 42a passes a low frequency component of the output from the multiplier 32, and cuts off a high frequency component thereof. The low-pass filter 42b passes a low frequency component of the output from the multiplier 34, and cuts off a high frequency component thereof.

The A/D converter 44a converts an output from the low-pass filter 42a into a digital signal. The A/D converter 44b converts an output from the low-pass filter 42b into a digital signal. It should be noted that a sampling frequency of the A/D converters 44a and 44b is an integer multiple of a division of $\omega 10-\omega 20=2\omega 1$ by $2\pi$. Namely, the sampling frequency is an integer multiple of $\omega 1/\pi$.

The complex FFT (Fast Fourier Transform) section 46 applies the complex fast Fourier transform to the outputs from the A/D converters 44a and 44b. As a result, complex vectors are acquired for the input frequency components ($\pm\omega 1$) and the distortion component ($+3\omega 1$).

The phase determination section 48 determines the phases of the respective components based upon the complex vectors of the input frequency components ($\pm\omega 1$) and the distortion component ($+3\omega 1$). The phase is calculated as tan$^{-1}$(imaginary part of complex vector/real part of complex vector). The phase of the input frequency component +ω1 is denoted by θ1; the phase of the input frequency component −ω1 is denoted by θ2; and the phase of the distortion component +3ω1 is denoted by θ3. θ1, θ2, and θ3 are functions of time. In the following section, a phase at time "t" is expressed as θ1(t), for example.

With reference again to FIG. 1, the match time/phase measurement section 50 measures match time Δt when the phase θ1 of the input frequency component +ω1 and the phase θ2 of the input frequency component −ω1 match for the first time, and the phase θ1(Δt) (=θ2(Δt)) thereat based upon the acquisition result by the phase acquisition section 40.

A complex vector s1 for the input frequency component +ω1, and a complex vector s2 for the input frequency component −ω1 are represented by the following equations.

$$s1 = A1 \times e^{j(\omega 1 \times t + \theta 1(0))} \quad \text{[EQU. 1]}$$

$$s2 = A2 \times e^{j(-\omega 1 \times t + \theta 2(0))}$$

Figure 4:
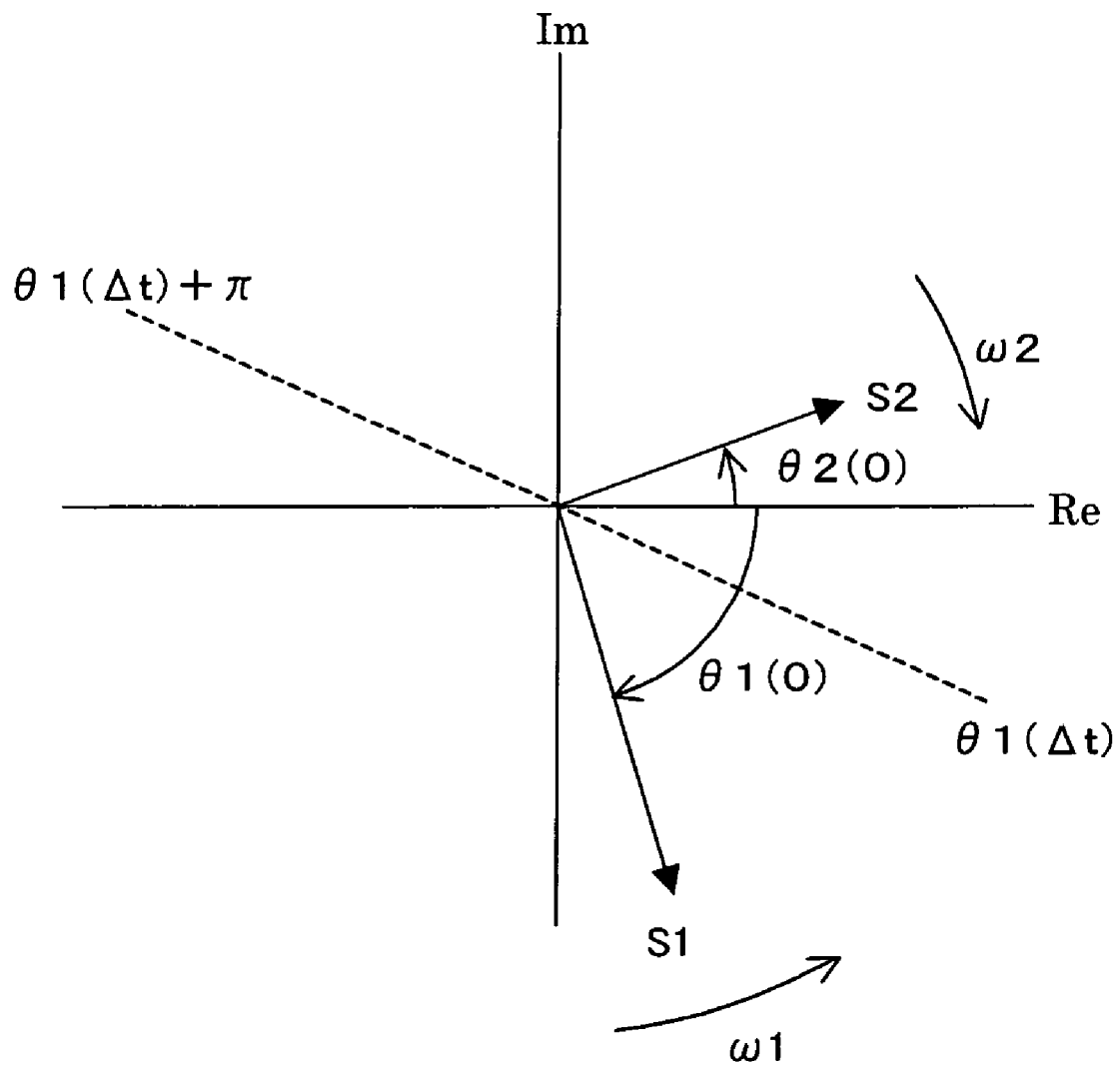
FIG. 4 shows initial states (states at time t=0) of the complex vectors s1 and s2.

As the above equations clearly show, although the complex s1 and s2 are different in magnitude, they rotate at the same rotation speed in directions opposite to each other. In FIG. 4 are shown initial states (states at time t=0) of the complex vectors s1 and s2. In FIG. 4, Im (imaginary part) is assigned to the vertical axis, and Re (real part) is assigned to the horizontal axis. An initial phase of the complex vector s1 is θ1(0), and an initial phase of the complex vector s2 is θ2(0). The phases of the complex vectors s1 and s2 match at the time Δt for the first time. On this occasion the phase θ1(Δt) (=θ2(Δt)) is expressed by the following equation.

$$\frac{-\theta 1(0) + \theta 2(0)}{2} + \theta 1(0) = \theta 1(\Delta t) \quad \text{[EQU. 2]}$$

Since the complex vectors s1 and s2, whose phases become θ1(Δt) at the time Δt, rotate at the same rotation speed in the directions opposite to each other, the phases of the complex vectors s1 and s2 match at θ1(Δt)+π when they have rotated by ½. The time is Δt+π/ω1 on this occasion. The phases then match at θ1(Δt) again. The time is Δt+2π/ω1 on this occasion. In this way, the phases match at time Δt+n·π/ω1 (n=0, 1, 2, . . . ) and the phases of the complex vectors s1 and s2 on this occasion are θ1(Δt) (n=0, 2, 4, . . . ) or θ1(Δt)+π (n=1, 3, 5, . . . ).

Figure 5:
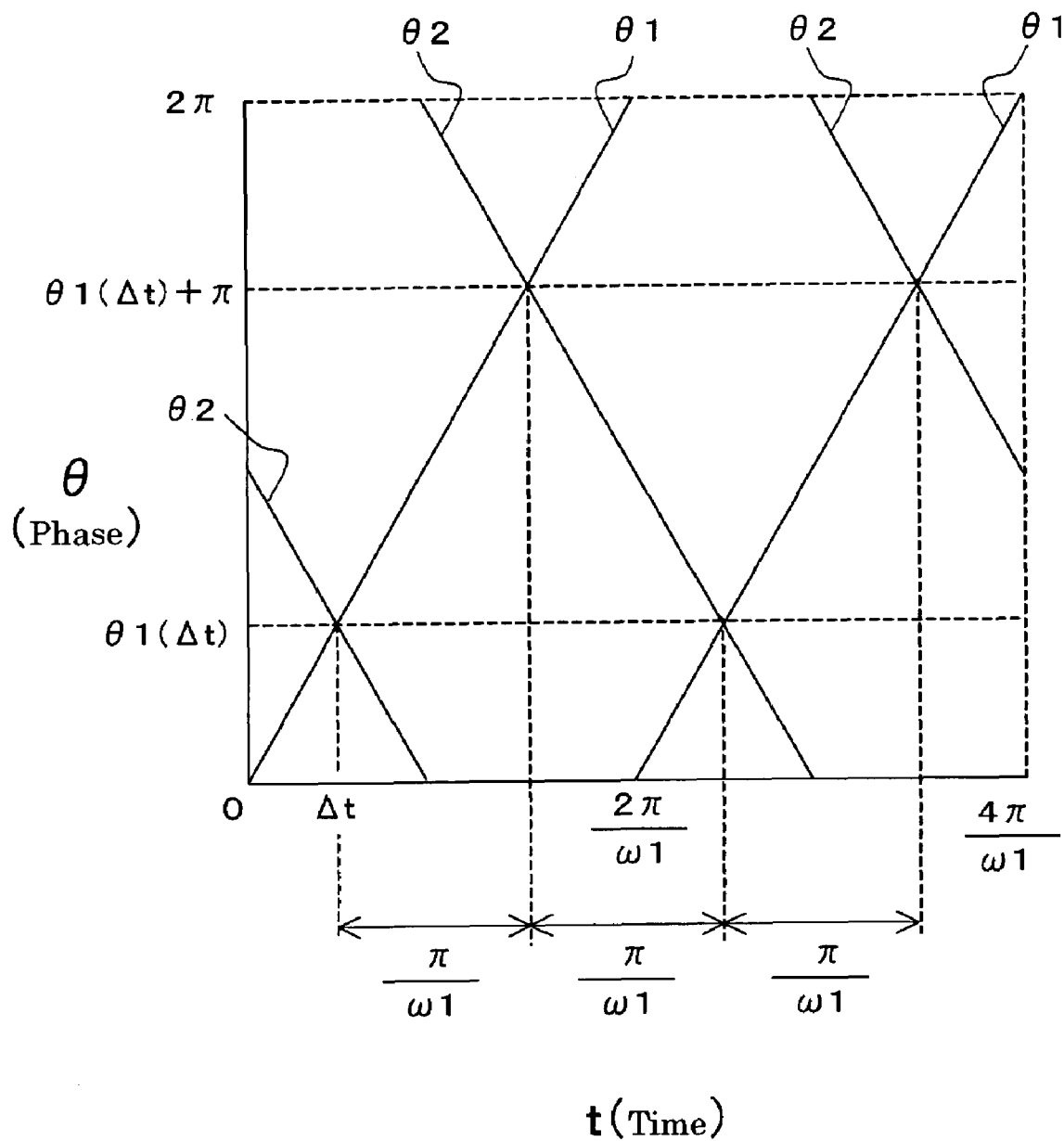
FIG. 5 is a chart showing relationships between the phase $\theta 1$ of the complex vector s1 and the phase $\theta 2$ of the complex vector s2 and the time "t"

FIG. 5 shows relationships between the phase θ1 of the complex vector s1 and the phase θ2 of the complex vector s2 and the time "t" as a chart. It should be noted that θ1(0)=0 for the sake of the illustration. As clearly shown in FIG. 5, the phases of the complex vectors s1 and s2 match at time Δt+n·π/ω1 (n=0, 1, 2, . . . ) and the phases of the complex vectors s1 and s2 on this occasion are θ1(Δt) (n=0, 2, 4, . . . ) or θ1(Δt)+π (n=1, 3, 5, . . . ).

The distortion component phase measurement section 60 measures the phase θ3(Δt) of the distortion component +3ω1 at the match time Δt based upon the acquisition result by the phase acquisition section 40. The match time Δt is acquired from the match time/phase measurement section 50.

A complex vector s3 for the distortion component +3ω1 is represented by the following equation.

$$s3 = A3 \times e^{j(3\omega 1 \times t + \theta 3(0))} \quad \text{[EQU. 3]}$$

As the above equation clearly shows, the complex vector s3 makes three turns while the complex vector s1 rotates once. If the complex vector s1 makes ½ turn, the complex vector s3 makes 3/2 turn.

As a result, if the complex vector s1 makes a turn from the phase θ1(Δt), since the complex vector s3 makes three turns, and the phase of the complex vector s3 returns to the initial phase. Thus, if the complex vector s1 makes "n" turns from the phase θ1(Δt) (n=1, 2, . . . ), the phase of the complex vector s3 returns to the phase θ3(Δt) of the distortion component +3ω1 at the match time Δt.

Moreover, if the complex vector s1 makes ½ turn from the phase θ1(Δt), since the complex vector s3 makes 3/2 turn, and the phase of the complex vector s3 advances by π. As a result, if the phase of the complex vector s1 becomes θ1(Δt)+π, the phase of the complex vector s3 becomes θ3(Δt)+π.

Figure 6:
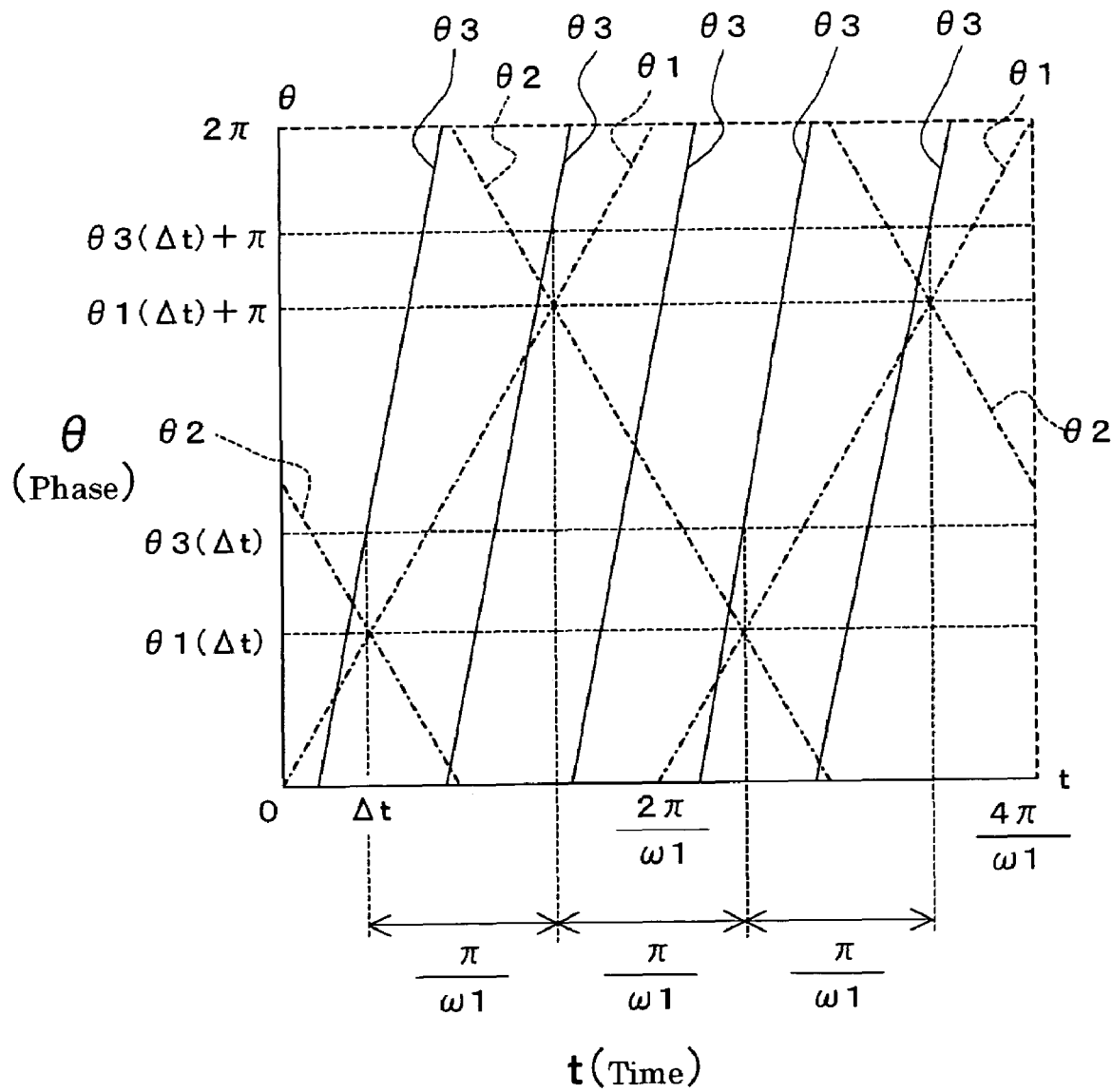
FIG. 6 is a chart showing relationships between the phase $\theta 1$ of the complex vector s1, the phase $\theta 2$ of the complex vector s2, and the phase $\theta 3$ of the complex vector s3 and the time "t".

FIG. 6 shows relationships between the phase θ1 of the complex vector s1, the phase θ2 of the complex vector s2, and the phase θ3 of the complex vector s3 and the time "t" as a chart. It should be noted that θ1 and θ2 are represented as a short dashed long dashed lines, and θ3 is represented as solid lines in FIG. 6. As FIG. 6 clearly shows, the phase of the complex vector s3 is θ3(Δt) at the time Δt+n·π/ω1 (n=0, 2, 4, . . . ), and the phase of the complex vector s3 is θ3(Δt)+π at the time Δt+n·π/ω1 (n=1, 3, 5, . . . ).

In this way, the phases at which the complex vectors s1 and s2 match take constant values such as θ1(Δt) and θ1(Δt)+π. At the same time, the phases of the complex vector s3 at which the complex vectors s1 and s2 match also take constant values such as θ3(Δt) and θ3(Δt)+π. Thus, it is significant to measure θ1(Δt) as the value which represents the phase of the input frequency components ±ω1, and θ3(Δt) as the value which represents the phase of the distortion component +3ω1.

It should be noted that a relative phase of the complex vector s3 when the complex vectors s1 and s2 match with respect to the phase at which the complex vectors s1 and s2 match takes a constant value θ3(Δt)−θ1(Δt).

The display section 70 displays the measurement result θ1(Δt) by the match time/phase measurement section 50, and the measurement result θ3(Δt) by the distortion component phase measurement section 60.

A description will now be given of an operation of the embodiment of the present invention.

First, the signal of the frequency ω10 output from the first oscillator 12, and the signal of the frequency ω20 output from the second oscillator 14 are added by the adder 16, and is fed as the input signal to the amplifier 20. The frequency spectrum of the input signal is shown in FIG. 2(a).

The input signal is amplified by the amplifier 20. It should be noted that the amplifier 20 is a type of a non-linear circuit, and thus outputs the distortion components (components with the frequency ω30 and the frequency ω40) in addition to the components with the frequency ω10 and the frequency ω20 (refer to FIG. 2(b)).

The output from the amplifier 20 is fed to the phase measurement device 1. The phase measurement device 1 serves to measure the output from the amplifier 20.

First, the output from the amplifier 20 is converted by the orthogonal conversion section 30 by means of the orthogonal conversion using the average frequency ω0, which is the average of the input frequency components (of the frequency ω10 and the frequency ω20). As a result, the output from the amplifier 20 can be treated as the input frequency components ±ω1, and the distortion frequency components ±3ω1 (refer to FIG. 2(c)). The orthogonal conversion section 30 has two types of the outputs, which are the output from the multiplier 32 and the output from the multiplier 34.

The high frequency component of the output from the multiplier 32 is cut off by the low-pass filter 42a, and the resulting signal is converted into the digital signal by the A/D converter 44a, and is fed to the complex FFT section 46. The high frequency component of the output from the multiplier 34 is cut off by the low-pass filter 42b, and the resulting signal is converted into the digital signal by the A/D converter 44b, and is fed to the complex FFT section 46. The complex FFT section 46 carries out the complex fast Fourier transform, and acquires the complex vectors for the input frequency components ($\pm\omega1$) and the distortion component ($+3\omega1$). The phase determination section 48 receives the complex vectors, and determines the phases of the respective components.

The match time/phase measurement section 50 receives the phase $\theta1$ of the input frequency component $+\omega1$ and the phase $\theta2$ of the input frequency component $-\omega1$ out of the outputs from the phase determination section 48, and measures the match time $\Delta t$ at which $\theta1$ and $\theta2$ match for the first time, and the phase $\theta1(\Delta t)$ ($=\theta2(\Delta t)$) thereat (refer to FIG. 5).

The distortion component phase measurement section 60 receives the phase $\theta3$ of the distortion component $+3\omega1$ out of the outputs from the phase determination section 48, further receives the match time $\Delta t$ from the match time/phase measurement section 50, and measures the phase $\theta3(\Delta t)$ of the distortion component $+3\omega1$ at the match time $\Delta t$ (refer to FIG. 6).

The display section 70 displays the measurement result $\theta1(\Delta t)$ by the match time/phase measurement section 50, and the measurement result $\theta3(\Delta t)$ by the distortion component phase measurement section 60.

According to the embodiment of the present invention, the match time/phase measurement section 50 is caused to measure $\theta1(\Delta t)$ significant as a value representing the phase of the input frequency component $\pm\omega1$. Moreover, the distortion component phase measurement section 60 is caused to measure $\theta3(\Delta t)$ significant as a value representing the phase of the distortion component $+3\omega1$. Moreover, the display section 70 is caused to display $\theta1(\Delta t)$ and $\theta3(\Delta t)$. It is thus possible to measure and display the significant values as the values representing the phases of the distortion of the signal output from the amplifier 20 and the input frequency components.

It should be noted that the A/D converters 44a and 44b may be provided between the amplifier 20 and the phase measuring device 1 in stead of providing between the low-pass filters 42a and 42b and the complex FFT section 46.

Moreover, the above-described embodiment may be realized in the following manner. A computer is provided with a CPU, a hard disk, and a media (such as a floppy disk (registered trade mark) and a CD-ROM) reader, and the media reader is caused to read a medium recording a program realizing the above-described respective components (such as the match time/phase measurement section 50 and the distortion component phase measurement section 60), thereby installing the program on the hard disk. This method may also realize the above-described embodiments.

The invention claimed is:

1. A phase measurement device that measures an output from a circuit to be measured upon feeding an input signal having at least two input frequency components to the circuit to be measured, comprising:

a phase acquisitioner that acquires phases of input frequency components and a distortion component based upon an average frequency which is an average of the input frequency components;

a match time measurer that measures a match time at which the phases of the input frequency components match, based upon an acquired result by said phase acquisitioner; and a distortion component phase measurer that measures a phase of the distortion component at the match time, based upon an acquired result by said phase acquisitioner, wherein said output from the circuit to be measured has said input frequency components and said distortion componets, whose frequency differs from frequencies of said input frequency components.

2. The phase measurement device of claim 1, wherein said phase acquisitioner comprises:

an orthogonal converter that applies an orthogonal conversion to the output from the circuit to be measured using an average frequency which is an average of the input frequency components; and a phase acquisitioner that acquires phases of the input frequency components and the distortion component in an output from said orthogonal converter.

3. The phase measurement device of claim 1, further comprising a match phase measurer that measures phases of the input frequency components at the match time.

4. The phase measurement device of claim 1, wherein the circuit to be measured comprises an amplifier.

5. The phase measurement device of claim 2, wherein said phase acquisitioner comprises a complex Fast Fourier Transformer that carries out a complex Fast Fourier Transform.

6. The phase measurement device of claim 5, wherein said complex Fast Fourier Transformer acquires a complex vector for a digital signal.

7. The phase measurement device of claim 1, further comprising a display that displays a result of the measurement by said distortion component phase measurer.

8. The phase measurement device of claim 3, further comprising a display that displays a result of the measurement by said match phase measurer, and a result of the measurement by said distortion component phase measurer.

9. A phase measurement method for measuring an output from a circuit to be measured upon feeding an input signal having at least two input frequency components to the circuit to be measured, comprising:

acquiring phases of input frequency components and a distortion component based upon an average frequency which is an average of the input frequency components;

measuring a match time at which the acquired phases of the input frequency components match; and measuring a phase of the acquired distortion component at the match time, wherein the output from the circuit to be measured has the input frequency components and the distortion component, whose frequency differs from frequencies of the input frequency components.

10. A program of instructions for execution by a computer to perform a phase measurement process of a phase measurement device that measures an output from a circuit to be measured upon feeding an input signal having at least two input frequency components to the circuit to be measured, having a phase acquisitioner that acquires phases of input frequency components and a distortion component based upon an average frequency which is an average of the input frequency components, said phase measurement process comprising:

measuring a match time at which phases of input frequency components match, based upon an acquired result by said phase acquisitioner; and measuring a phase of the distortion component at the match time, based upon an acquired result by said phase acquisitioner, wherein the output from the circuit to be measured has the input frequency components and the distortion component, whose frequency differs from frequencies of the input frequency components.

11. A computer-readable medium having a program of instructions for execution by a computer to perform a phase measurement process of a phase measurement device that measures an output from a circuit to be measured upon feeding an input signal having at least two input frequency components to the circuit to be measured, having a phase acquisitioner that acquires phases of input frequency components and a distortion component based upon an average frequency which is an average of the input frequency components, said phase measurement process comprising:

measuring a match time at which the phases of the input frequency components match, based upon an acquired result by said phase acquisitioner; and measuring a phase of the distortion component at the match time, based upon an acquired result by said phase acquisitioner, wherein the output from the circuit to be measured has the input frequency components and the distortion component, whose frequency differs from frequencies of the input frequency components.

* * * * *

UNITED STATES PATENT AND TRADEMARK OFFICE
CERTIFICATE OF CORRECTION

PATENT NO. : 7,323,883 B2 Page 1 of 1
APPLICATION NO. : 10/557596
DATED : January 29, 2008
INVENTOR(S) : J. Nakada It is certified that error appears in the above-identified patent and that said Letters Patent is hereby corrected as shown below:

Title Page of the printed patent, at Item (56), References Cited, Foreign Patent Documents, "2001-251211" should be -- 2001-285211 --.

Signed and Sealed this

Twenty-second Day of July, 2008

JON W. DUDAS
*Director of the United States Patent and Trademark Office*